United States Patent [19]

Mochizuki

[11] Patent Number: 5,329,492

[45] Date of Patent: Jul. 12, 1994

[54] SEMICONDUCTOR MEMORY DEVICE HAVING IMPROVED CONNECTIONS BETWEEN WORD LINES AND MEMORY CELL ARRAY BLOCKS

[75] Inventor: Hirohiko Mochizuki, Kawasaki, Japan

[73] Assignee: Fujitsu Limited, Kanagawa, Japan

[21] Appl. No.: 978,837

[22] Filed: Nov. 19, 1992

[30] Foreign Application Priority Data

Nov. 20, 1991 [JP] Japan .................................. 3-304955

[51] Int. Cl.$^5$ ............................................... G11C 7/00
[52] U.S. Cl. ........................... 365/230.01; 365/230.03; 365/230.06; 365/205
[58] Field of Search ...................... 365/230.01, 230.03, 365/230.06, 189.01, 208, 207, 190, 205

[56] References Cited

U.S. PATENT DOCUMENTS 4,636,982  1/1987  Takemae et al. ................. 365/230.03
4,926,382  5/1990  Sakui et al. ...................... 365/205
5,222,047  6/1993  Matsuda et al. ................. 365/230.03

FOREIGN PATENT DOCUMENTS 62-114193  5/1987  Japan .

Primary Examiner—Eugene R. LaRoche
Assistant Examiner—Vu A. Le
Attorney, Agent, or Firm—Nikaido, Marmelstein, Murray & Oram

[57] ABSTRACT

A semiconductor memory device includes a memory cell array divided into a plurality of blocks respectively having bit lines, word lines, and memory cells coupled to the bit lines and word lines. A plurality of sense amplifiers, which are provided for the blocks and connected to the bit lines, sense and amplify information stored in the memory cells. A first unit selects one of the word lines for each of the blocks so that at least one of selected word lines is located at a distance from a corresponding one of the plurality of sense amplifiers. The above distance is different from distances from other sense amplifiers at which other selected word lines are located. A second unit sequentially activates the plurality of sense amplifiers, starting from one of the blocks having one of the selected word lines located at a shortest distance from a corresponding one of the plurality of sense amplifiers.

14 Claims, 12 Drawing Sheets

SEMICONDUCTOR MEMORY DEVICE HAVING IMPROVED CONNECTIONS BETWEEN WORD LINES AND MEMORY CELL ARRAY BLOCKS

BACKGROUND OF THE INVENTION

1. Field of the Invention

The present invention generally relates to semiconductor memory devices, and more particularly to improvements in connections between word lines and memory cell array blocks.

2. Description of the Prior Art

Recently, there has been considerable effort towards increasing memory capacity. As the memory capacity increases, charging and discharging of currents flowing in bit lines increases. This increases an instantaneous or peak current flowing in the memory when sense amplifiers operate. Hence, the potential of a power supply decreases and the ground potential increases. These phenomena cause erroneous detection of the logical levels of input signals and cause the device to malfunction.

In order to eliminate the above disadvantages, an improved arrangement has been proposed in which a memory cell array is divided into a plurality of blocks, and sense amplifiers and active pull-up circuits respectively related to the memory cell blocks are activated at different operation timings. With the above arrangement, it becomes possible to reduce the instantaneous current flowing in the memory when the sense amplifiers and/or the active pull-up circuits operate.

The above arrangement is proposed in Japanese Laid-Open Patent Publication No. 62-114193. FIG. 1 shows the arrangement shown in the above publication. The entire memory cell array is equally divided into four memory cell blocks MA1–MA4, which respectively include peripheral circuits, such as sense amplifiers, address decoders and input/output buffers. Each of the memory cell blocks MA1–MA4 has a memory capacity equal to ¼ the memory capacity of the entire memory cell array. An active pull-up circuit driving system 20 supplies active pull-up operation starting signals $\phi R1$, $\phi R2$, $\phi R3$ and $\phi R4$ to the memory cell blocks MA1, MA2, MA3 and MA4, respectively. These signals $\phi R1$–$\phi R4$ are applied, as clock signals $\phi R$, to active pull-up circuits in the memory cell blocks MA1–MA4, respectively. Hence, the active pull-up circuits in the memory cell blocks MA1–MA4 start respective active pull-up operations in response to receipt of the clock signals $\phi R1$–$\phi R4$.

FIG. 2 is a circuit diagram showing the periphery of a sense system in a conventional DRAM (Dynamic Random Access Memory). FIG. 3 is a waveform diagram of signals observed at nodes in the circuit configuration shown in FIG. 2. Symbols shown in FIG. 3 have the same meanings as corresponding symbols shown in FIG. 2. A signal /RAS ("/" means a low active signal and /RAS corresponds to $\overline{RAS}$ in FIG. 3).

A pair of bit lines BL and XBL are connected to data buses I/O and XI/O via transistors Q00 and Q01, which are turned ON and OFF in response to an output signal of a column decoder 10. Memory cells MC, each having one transistor and one capacitor, are alternately connected to the bit lines BL and XBL. The memory cells MC connected to the bit line XBL are called dummy memory cells DMC. Word lines WL are respectively connected to the memory cells MC connected to the bit line BL, and dummy word lines WLDM are respectively connected to the dummy memory cells DMC connected to the bit line XBL. When one of the word lines WL is selected, the capacitor of the corresponding memory cell MC is connected to the bit line BL. When one of the dummy word lines WLDM is selected, the capacitor of the corresponding dummy memory cell DMC is connected to the bit line XBL. The bit lines BL and XBL are coupled to a precharge power supply line VPR via transistors $Q_{PR0}$ and $Q_{PR1}$, respectively. These transistors $Q_{PR0}$ and $Q_{PR1}$ are concurrently turned ON and OFF in response to a precharge clock signal $\phi PR$.

A sense amplifier SA and an active pull-up circuit AP are connected to the bit lines BL and XBL. The sense amplifier SA senses and amplifies the difference between the potentials of the bit lines BL and XBL. The operation of the sense amplifier SA is controlled by a sense amplifier driving signal $\phi S$. The active pull-up circuit AP comprises transistors QAP0, QR0 QAP1, and QR1, and capacitors CR0 and CR1. The transistors QAP0 and QR0, and the capacitor CR0 function to pull up the potential of the bit line BL. The transistors QAP1 and QR1, and the capacitor CR1 function to pull up the potential of the bit line XBL. More particularly, the transistor QAP0 pulls up the potential of the bit line BL, and is connected between the bit line BL and a power supply line VCC. The capacitor CR0 is used to boost the gate potential of the transistor QAP0. One end of the capacitor CR0 is connected to the gate of the transistor QAP0, and the other end thereof receives the active pull-up clock signal $\phi R$. The transistor QR0 functions to charge the capacitor CR0 up to a precharge voltage of the bit line BL, and is connected between the bit line BL and the capacitor CR0. The transistors QAP1 and QR1, and the capacitor CR1 are configured in the same manner as the above. The clock signal $\phi R$ is applied to the gates of the transistors QR0 and QR1.

FIG. 4 is a block diagram of the active pull-up circuit driving system 20 shown in FIG. 1. The system 20 comprises a clock signal generator 30 generating the clock signal $\phi R$, which is the same as the clock signal $\phi R1$ used in the circuit shown in FIG. 2. The clock signal $\phi R$ generated by the generator 30 is applied, as the clock signal $\phi R$, to the memory cell block MA1, and is applied to a delay circuit D11. The delay circuit D11 delays the clock signal $\phi R$, and outputs, as the clock signal $\phi R2$, a delayed clock signal to the memory cell block MA2. The above delayed clock signal is applied to a delay circuit D12, which delays it by a delay time identical to that of the delay circuit D11. A delayed clock signal generated by the delay circuit D12 is output, as the clock signal $\phi R3$, to the memory cell block MA3, and is applied to a delay circuit D13. The delay circuit D13 has the same delay time as the delay time of each of the delay circuits D11 and D12, and delays the delayed clock signal from the delay circuit D12. A delayed clock signal generated by the delay circuit D13 is output, as the clock signal $\phi R$, to the memory cell block MA4.

As shown in FIG. 5, the clock signals $\phi R1$–$\phi R4$ are generated, in that order, at different times. The pull-up operations of the memory cell blocks MA1–MA4 are respectively controlled by the clock signals $\phi R1$–$\phi R4$, and are activated at the different times. In this case, the instantaneous current can be greatly decreased, as compared with the case where the pull-up operations of the memory cell blocks MA1–MA4 are concurrently started. Hence, the load applied to the power supply can be reduced, and a small-scale power supply can be used.

FIG. 6 shows another control method similar to the method shown in FIGS. 4 and 5. A sense amplifier activating signal φLE is applied to a sense amplifier in one of a plurality of memory cell blocks. As shown in FIG. 12B, sense amplifier activating signals φLE11, φLE12, φLE13 and φLE14 are respectively applied to four memory cell blocks at different times in order to reduce the instantaneous current. That is, the instantaneous current flowing in the memory when the sense amplifiers in one of the four memories start to operate is less than the instantaneous current passing in the memory when the sense amplifiers of the entire memory cell array start to operate.

However, the above-mentioned conventional methods have the following disadvantages. As is well known, parasitic capacitors are coupled to bit lines. Hence, it takes a certain time for pieces of information stored in memory cells to be read therefrom after the corresponding word line is selected and to reach the corresponding sense amplifiers. The above time is longest when the word line furthest from the alignment of the sense amplifiers is selected. Hence, it is necessary to select the operation timing of the memory cell block which starts to operate first (the operation timing at which the clock signal φLE11 is activated) so that the above memory cell block starts to operate after pieces of information stored in the memory cells connected to the word line furthest from the sense amplifiers are completely read therefrom. Further, the clock signals φLE12, φLE13 and φLE14 are activated after the clock signal φLE11 is activated. Hence, it takes a long access time for all the memory cell blocks to start to operate. As a result, it is very difficult to reconcile the suppression of instantaneous current flowing when the sense amplifiers start to operate and the reduction in access time.

SUMMARY OF THE INVENTION

It is a general object of the present invention to provide a semiconductor memory device in which the above-mentioned disadvantages are eliminated.

A more specific object of the present invention is to provide a semiconductor memory device in which the instantaneous current flowing when the sense amplifiers start to operate can be suppressed and the access time can be reduced.

The above objects of the present invention are achieved by a semiconductor memory device comprising: a memory cell array divided into a plurality of blocks respectively having bit lines, word lines, and memory cells coupled to the bit lines and word lines; a plurality of sense amplifier devices, respectively provided for the blocks and connected to the bit lines, for sensing and amplifying information stored in the memory cells; first device, coupled to the word lines of the memory cell array, for selecting one of the word lines for each of the blocks so that at least one of selected word lines is located at a distance from a corresponding one of the plurality of sense amplifier devices, the distance being different from distances from other sense amplifier devices at which other selected word lines are located; and second device, coupled to the plurality of sense amplifier devices and the first device, for sequentially activating the plurality of sense amplifier devices, starting from one of the blocks having one of the selected word lines located at a shortest distance from a corresponding one of the plurality of sense amplifier devices.

The above objects of the present invention are also achieved by a semiconductor memory device comprising: a memory cell array divided into a plurality of blocks respectively having bit lines, word lines, and memory cells coupled to the bit lines and word lines; a plurality of sense amplifier devices, respectively provided for the blocks and connected to the bit lines, for sensing and amplifying information stored in the memory cells; first device, coupled to the word lines of the memory cell array, for selecting one of the word lines for each of the blocks so that selected word lines are located at mutually different distances from the plurality of sense amplifier devices; and second device, coupled to the plurality of sense amplifier devices and the first device, for sequentially activating the plurality of sense amplifier devices one by one, starting from one of the blocks having one of the selected word lines located at a shortest distance from a corresponding one of the plurality of sense amplifier devices.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
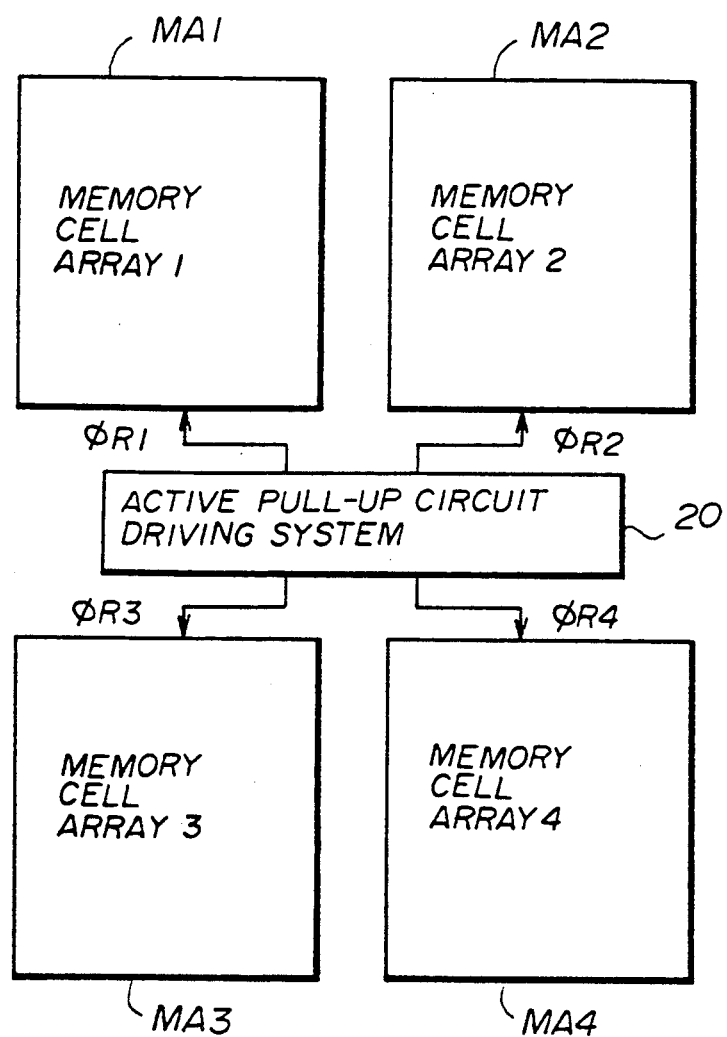
FIG. 1 is a block diagram of a conventional semiconductor memory device.
Figure 2:
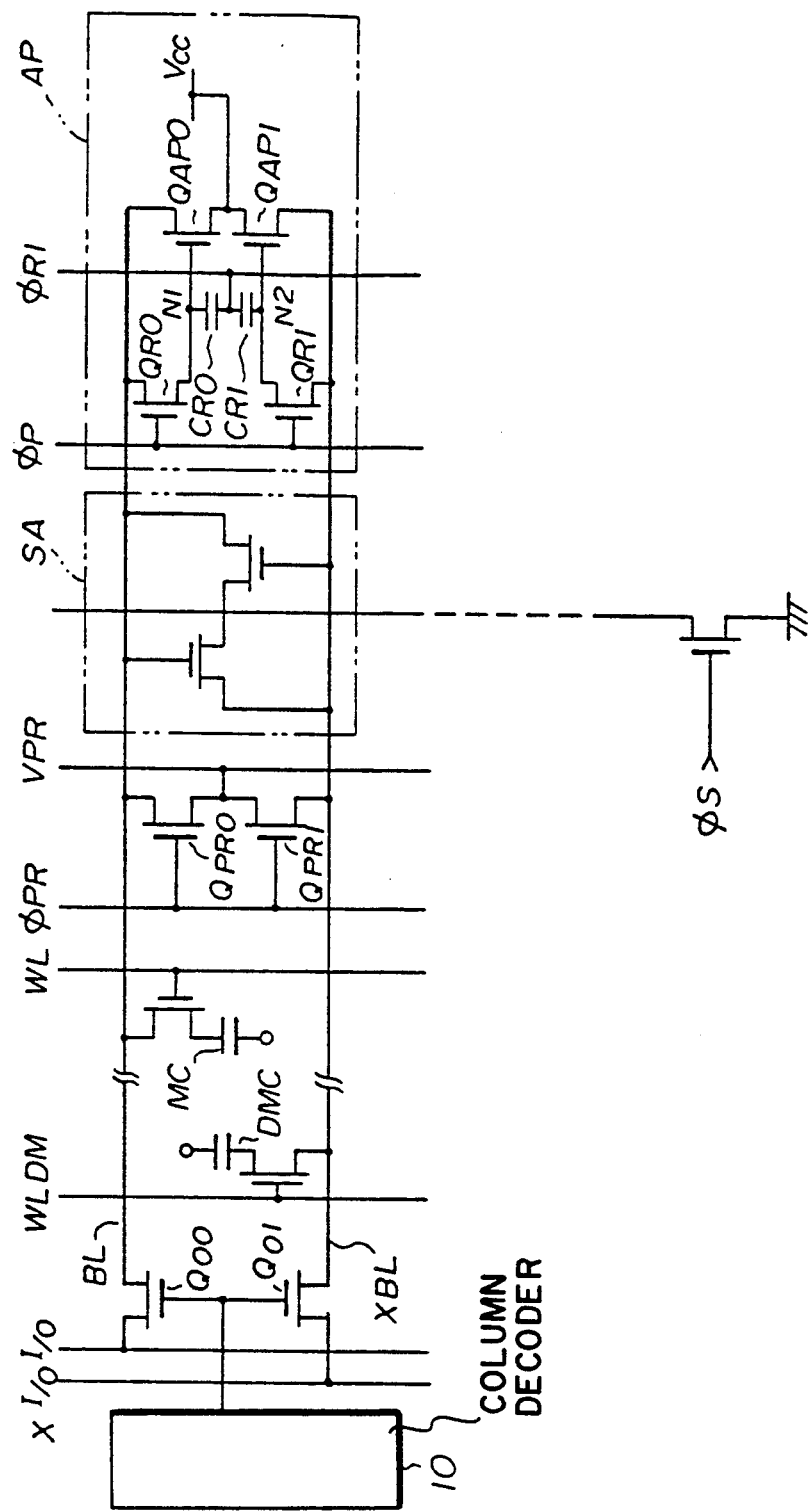
FIG. 2 is a circuit diagram of a conventional active pull-up circuit used in the memory device shown in FIG. 1.
Figure 3:
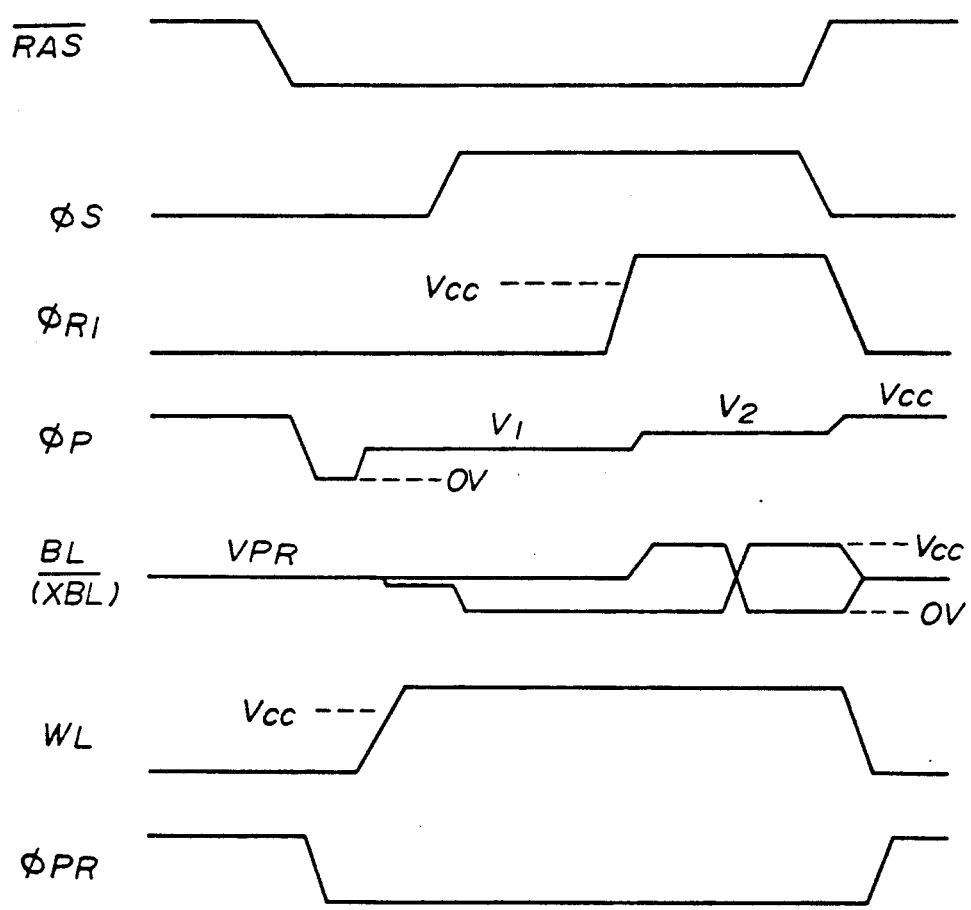
FIG. 3 is a waveform diagram showing the operation of the circuit shown in FIG. 2.
Figure 4:
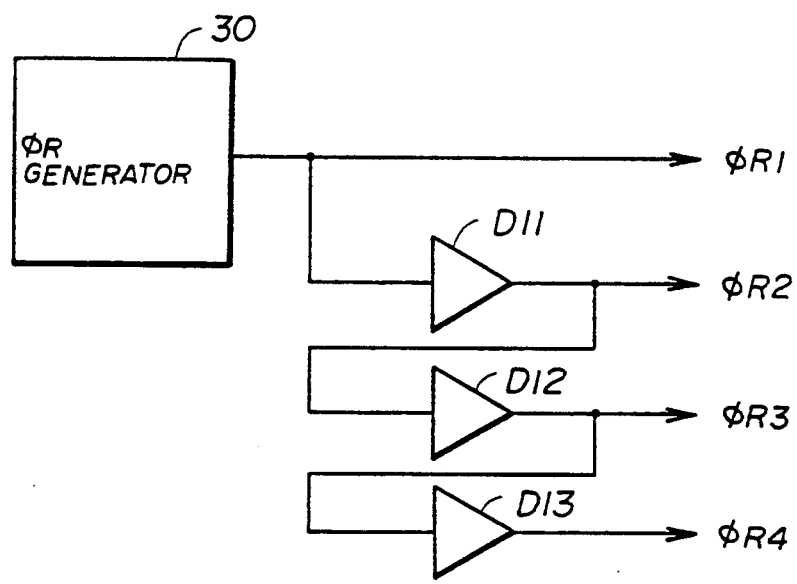
FIG. 4 is a block diagram of an active pull-up circuit driving system shown in FIG. 1.
Figure 5:
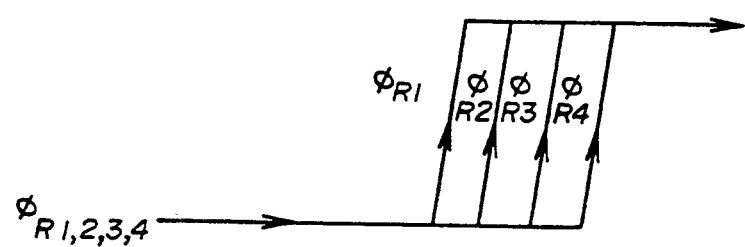
FIG. 5 is a waveform diagram showing the operation of the driving system shown in FIG. 4.
Figure 6:
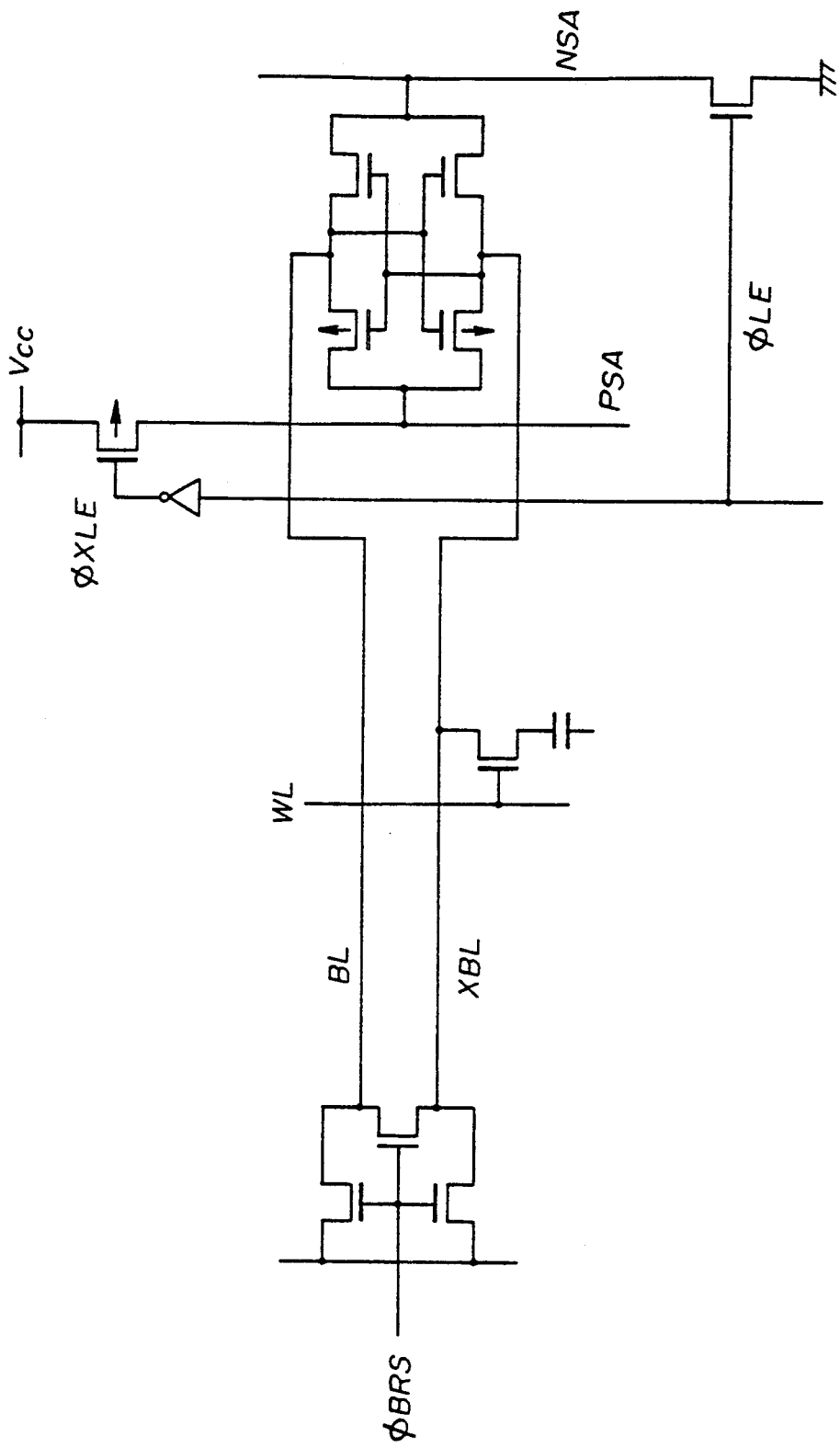
FIG. 6 is a circuit diagram of a sense amplifier circuit to which the active pull-up operation similar to that shown in FIGS. 4 and 5 is applied.
Figure 7A:
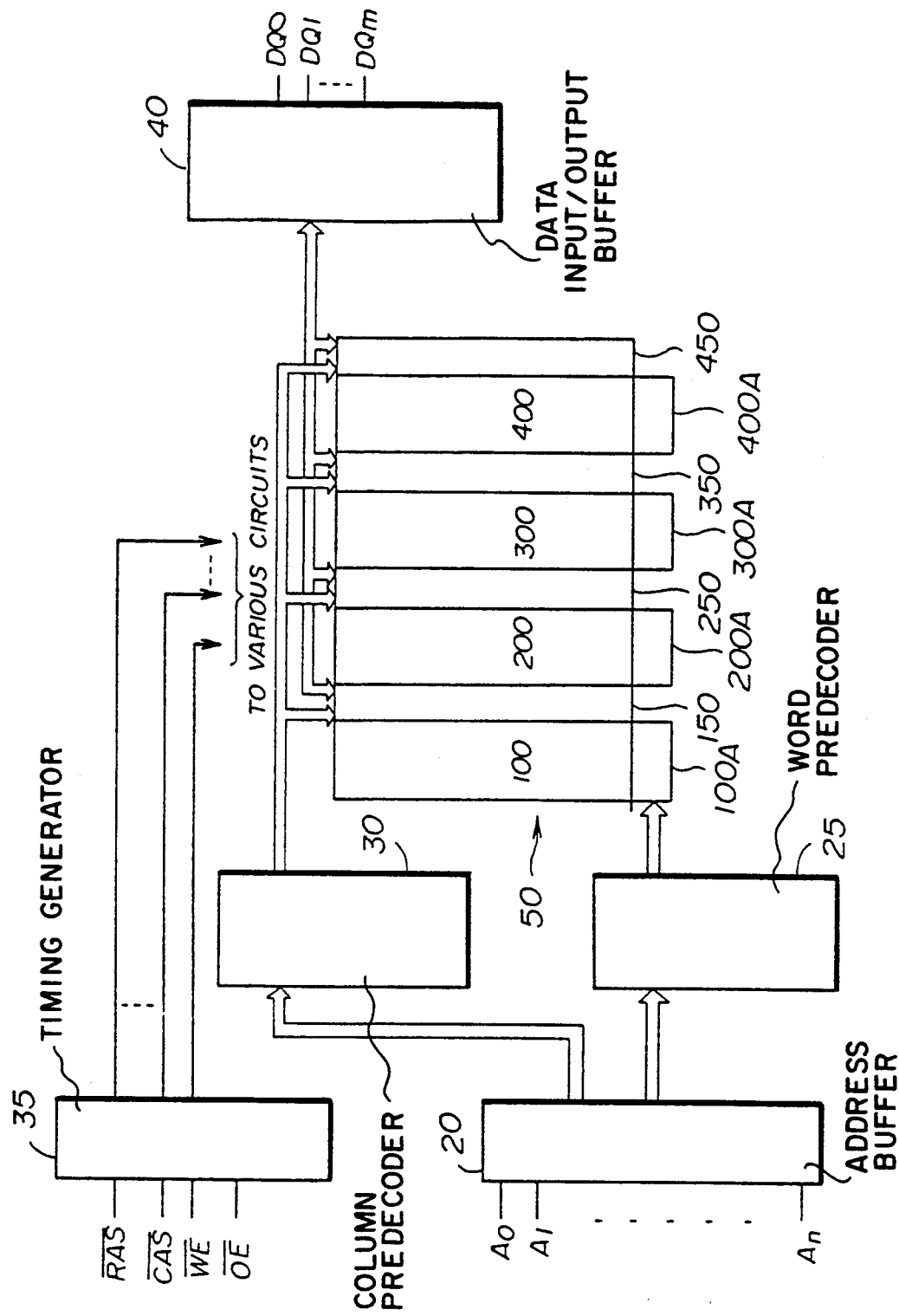
FIG. 7A is a block diagram of a dynamic random access memory according to an embodiment of the present invention.
Figure 7B:
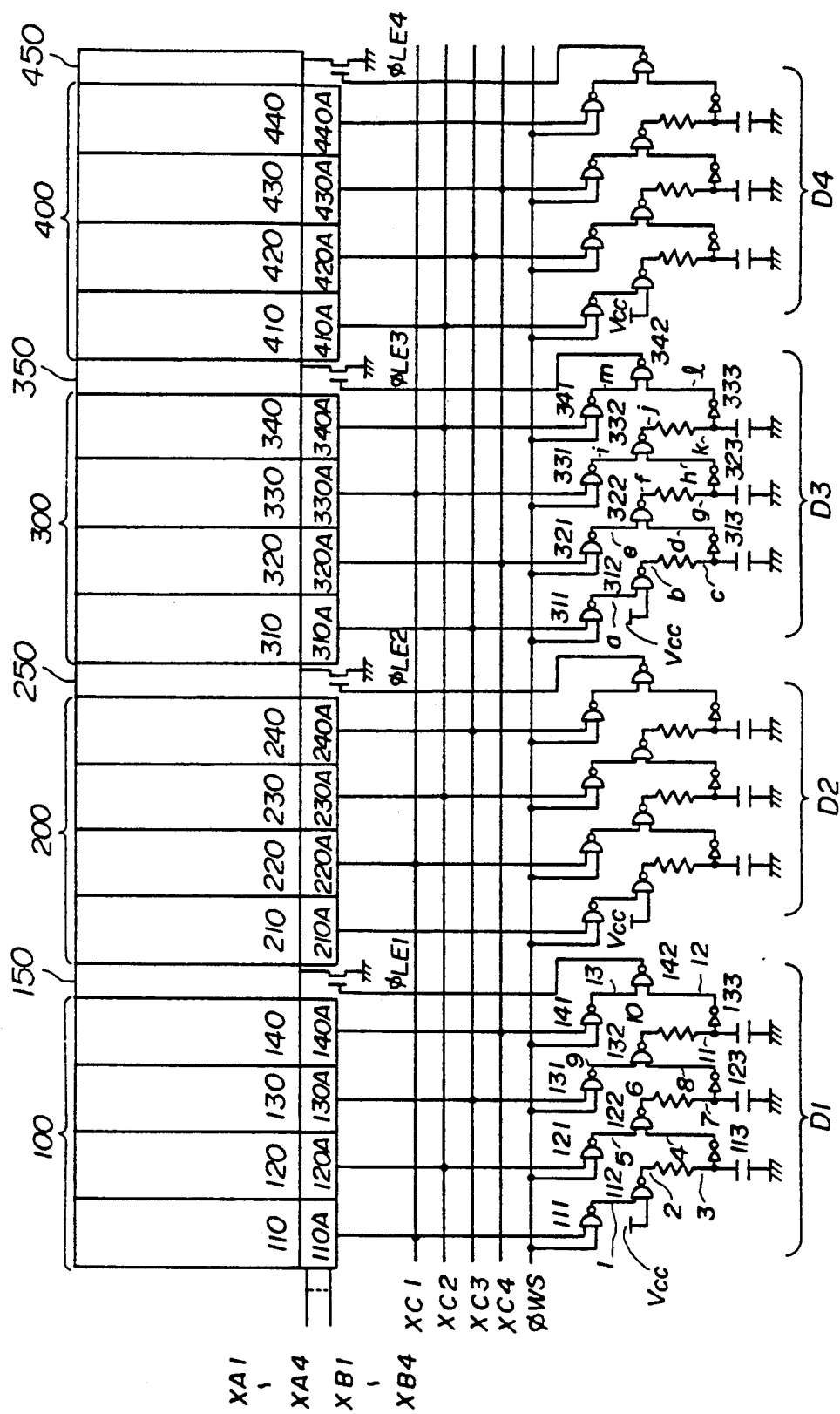
FIG. 7B is a block diagram of the details of the dynamic random access memory shown in FIG. 7A.

FIG. 7A shows an overview of a dynamic random access memory according to an embodiment of the present invention, and FIG. 7B shows an essential part of the device shown in FIG. 7A.

Referring to FIG. 7A, the DRAM comprises an address buffer 20, a word predecoder 25, a column predecoder 30, a timing generator 35, a data input/output buffer 40, and a memory cell array 50. The address buffer 20 receives address bits A0-An of an address signal, and outputs the address bits A0-An and the inverted versions $\overline{A0-An}$ thereof. The word predecoder 25 receives the address bits from the address buffer 20 and generates predecoded row (word) address signals. The column predecoder 30 receives the address bits from the address buffer 20 and generates predecoded column address signals. The timing generator 35 receives various control signals, such as a row address strobe signal /RAS, a column address strobe signal /CAS, a write enable signal /WE and an output enable signal /OE, and generates various signals, such as timing signals, control signals and clock signals. The data input/output buffer 40 receives data DQ0-DQM from an external device and send the data to the external device.

Referring to FIG. 7B, The entire memory cell array 50 is segmented into four main blocks 100, 200, 300 and 400. Each of the blocks 100-400 includes four sub blocks. More particularly, the main block 100 includes four sub blocks 110, 120, 130 and 140, and the main block 200 includes four sub blocks 210, 220, 230 and 240. The main blocks 300 includes four sub blocks 310, 320, 330 and 340, and the main block 400 includes four sub blocks 410, 420, 430 and 440.

The semiconductor memory device shown in FIGS. 7A and 7B also comprises sense amplifier/column decoder units 150, 250, 350 and 450 respectively related to the main blocks 100, 200, 300 and 400. The sub block 110 of the main block 100 is furthest from the sense amplifier 150, and the sub block 140 is closest thereto. Sense amplifier activating signals $\phi$LE1, $\phi$LE2, $\phi$LE3 and $\phi$LE4 are respectively applied to the units 150, 250, 350 and 450 via respective transistors shown in FIG. 7B.

Predecoded row address signals XA1-XA4 and XB1-XB4 from the word predecoder 25 are applied, via respective row address lines, to the main blocks 100, 200, 300 and 400. For the sake of convenience, FIG. 7B is illustrated as if only the predecoded row address signals XA1-XA4 and XB1-XB4 are applied to the main block 100. Further, predecoded row address signals XC1-XC4 from the word predecoder 25 are applied to the main blocks 100-400 via respective row address lines. More particularly, each of the address signals XC1-XC4 is applied to one sub block in each of the main blocks 100-400. For example, the predecoded row address signal XC1 is applied to the sub blocks 110, 220, 330 and 440 of the respective main blocks 100, 200, 300 and 400.

The main blocks 100, 200, 300 and 400 respectively include word decoder units 100A, 200A, 300A and 400A, as shown in FIG. 7A. More particularly, as shown in FIG. 7B, the sub blocks 110, 120, 130 and 140 of the main block have word decoders 110A, 120A, 130A and 140A, respectively. Similarly, the sub blocks 210, 220, 230 and 240 have word decoders 210A, 220A, 230A and 240A, respectively, and the sub blocks 310, 320, 330 and 340 have word decoders 310A, 320A, 330A and 340A, respectively. Further, the sub blocks 410, 420, 430 and 440 have word decoders 410A, 420A, 430A and 440A, respectively.

Each of the word decoders receives one of the predecoded row address signals XA1-XA4, one of the predecoded signals XB1-XB4, and one of the predecoded signals XC1-XC4. That is, each of the word decoders receives three predecoded signals (three bits) and selects one word line.

It will now be defined so that the sub blocks 110, 120, 130 and 140 of the main block 100 are located at the first, second, third and fourth sub-block positions. That is, the first sub-block position is furthest from the sense amplifier/column decoder unit 150, and the fourth sub-block position is closest to the unit 150. The above holds true for each of the other main blocks 200, 300 and 400. Each of the predecoded signal lines XC1-XC4 (the same symbols as for the predecoded signals are used for the sake of convenience) is connected to the mutually different sub-block positions of the main blocks. For example, the predecoded signal line XC1 is connected to the first, second, third and fourth sub-block positions of the main blocks 100, 200, 300 and 400, respectively. For example, the predecoded signal line XC2 is connected to the second, third, fourth and first sub-block positions of the main blocks 100, 200, 300 and 400, respectively.

The memory device shown in FIG. 7B includes delay circuits D1, D2, D3 and D4 respectively related to the main blocks 100, 200, 300 and 400 (these delay circuits are not shown in FIG. 7A for the sake of convenience). Each of the delay circuits D1-D4 receives the predecoded signals XC1-XC4 and a timing signal $\phi$WS. The timing signal $\phi$WS from the timing generator 35 is activated at the same time as one word line for each of the sub-blocks is selected. The delay circuit D1 comprises NAND gates 111, 121, 131 and 141, which gates respectively receive the timing signal $\phi$WS. One of the NAND gates 111, 121, 131 and 141 receives an activated one of the predecoded signals XC1-XC4 and the timing signal $\phi$WS starts the circuit. When the predecoded signal XC1 is activated, the delay circuit D1 has the longest delay time. When the predecoded signal XC4 is activated, the delay circuit D1 has the shortest delay time. The output signal ($\phi$LE1) of the delay circuit D1 is obtained via a NAND gate 142. As shown in FIG. 7B, the delay circuit D1 further includes NAND gates 112, 122 and 132 and 142, inverters 113, 123 and 133, resistors and capacitors. It can be seen from the above that the delay circuit D1 functions as a variable delay circuit having four control terminals formed by the NAND gates 111, 121, 131 and 141.

The control terminal for providing the shortest delay time is connected to the word decoder 140A of the sub block 140 closest to the sense amplifier/column decoder unit 150. The control terminal provided for the longest delay time is connected to the word decoder 110A of the sub block 110 furthest from the unit 150. Each of the other delay circuits D2, D3 and D4 respectively related to the main blocks 200, 300 and 400 is configured in the same manner as the delay circuit D1. For example, the delay circuit D3 comprises NAND gates 311, 312, 321, 322, 331, 332, 341 and 342, inverters 313, 323 and 333, three resistors, and three capacitors. The output signals $\phi$LE2, $\phi$LE3 and $\phi$LE4 are respectively applied to the sense amplifier/column decoder unit 250, 350 and 450 via the respective transistors.

Figure 8:
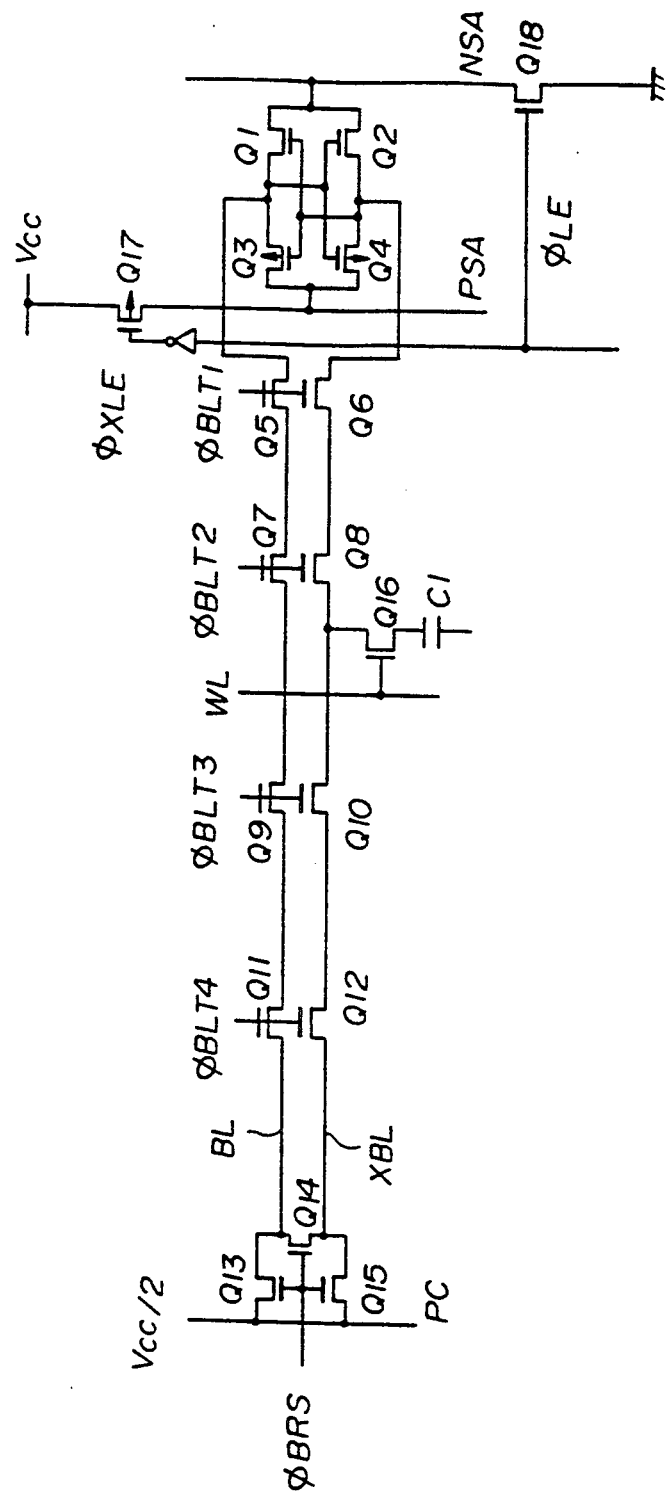
FIG. 8 is a circuit diagram of a sense amplifier and its peripheral circuits in the memory shown in FIGS. 7A and 7B.
Figure 9:
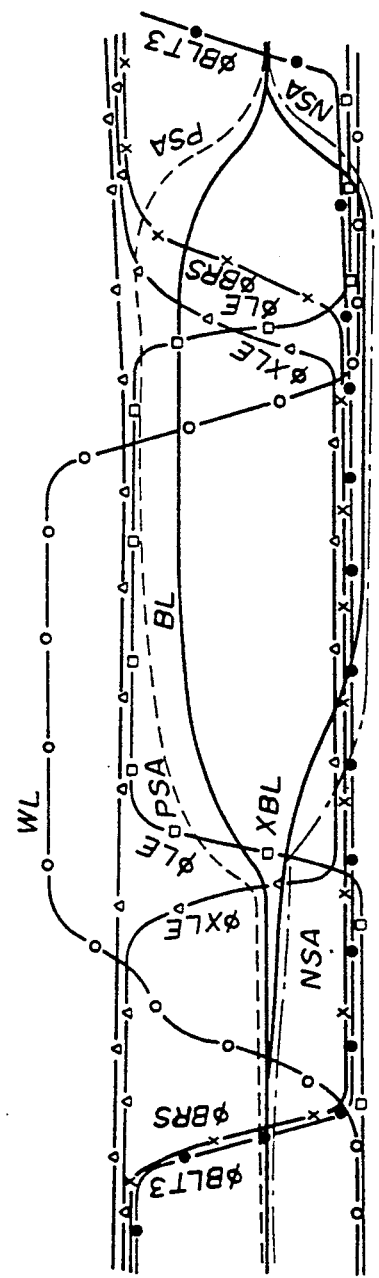
FIG. 9 is a timing chart showing the operation of the circuit shown in FIG. 8.

FIG. 8 shows one sense amplifier and its peripheral circuits provided in each of the main blocks 100–400. FIG. 9 shows the operation of the circuit configuration shown in FIG. 8. The sense amplifier shown in FIG. 8 comprises p-channel MOS transistors Q1 and Q2, and n-channel MOS transistors Q3 and Q4. The sense amplifier is activated in response to the clock sense amplifier activating signal $\phi$LE output from the corresponding delay circuit. More particularly, the sense amplifier has two terminals respectively coupled to the power supply line VCC and the ground via transistors Q17 and Q18 and respectively connected to sense amplifier output lines PSA and NSA. The sense amplifier activating signal $\phi$LE is applied to the gate of the transistor Q18, and the inverted version $\phi$XLE of the signal $\phi$LE is applied to the gate of the transistor Q17. The sense amplifier also has two terminals respectively connected to bit lines BL and XBL, which are segmented by means of transistors Q5–Q12. A timing signal $\phi$BLT1 is applied to the gates of the transistors Q5 and Q6, and a timing signal $\phi$BLT2 is applied to the gates of the transistors Q7 and Q8. A timing signal $\phi$BLT3 is applied to the gates of the transistors Q9 and Q10, and a timing signal $\phi$BLT4 is applied to the gates of the transistors Q11 and Q12. The above timing signals are supplied from the timing generator 35. A transistor Q16 and a capacitor C1 form a memory cell. A word line WL is connected to the gate of the transistor Q16. The bit lines BL and XBL are connected to a VCC/2 precharge power supply line via transistors Q13 and Q15, respectively. A transistor Q14 is connected between the bit lines BL and XBL. A bit line short-circuiting clock signal $\phi$BRS from the timing generator 35 is applied to the gates of the transistors Q13–Q15. The transistors Q13–Q15 form a bit line precharge circuit PC.

The circuit shown in FIG. 8 operates in the following way. Referring to FIG. 9, the timing signal $\phi$BRS is maintained at a high level, and thus the bit lines BL and XBL are maintained at a precharge level equal to VCC/2 (that is, the bit lines BL and XBL are maintained in a reset state). The timing signal $\phi$BRS is switched to a low level in order to disable the bit line precharge circuit PC, and concurrently the timing clock $\phi$BLT3 applied to the transistors Q9 and Q10 is switched to the low level. Hence, parts of the bit lines BL and XBL on the left sides of the transistors Q9 and Q10 are disconnected from the sense amplifier. Then, the word line WL is activated, and information stored in the memory cell consisting of the transistor Q16 and the capacitor C1 is transferred to the bit lines BL and XBL. The timing signals $\phi$BLT1 and $\phi$BLT2 continue to be maintained at the high level. After the word line WL is activated, the sense amplifier activating signal $\phi$LE is activated, so that the sense amplifier is turned ON. The sense amplifier senses and amplifies the difference between the potentials of the bit lines BL and XBL. In the example shown in FIG. 9, the sense amplifier output line PSA increases to the high level, and the sense amplifier output line NSA decreases to the low level. Thereafter, the sense amplifier activating signal $\phi$LE is turned OFF (switched to the low level), and the bit line short-circuiting clock signal $\phi$BRS is turned ON. Hence, the bit lines BL and XBL are maintained in the reset state.

Figure 10A:
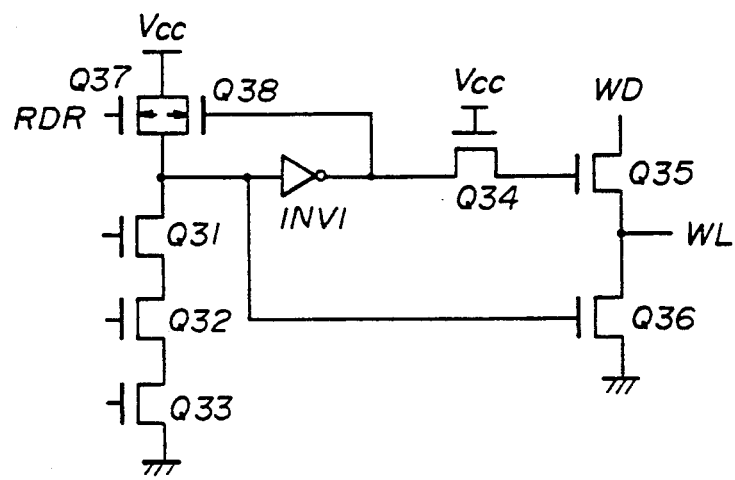
FIG. 10A is a circuit diagram of a word decoder shown in FIG. 7B.

FIG. 10A shows the configuration of each of the word decoders 110A–140A, 210A–240A, 310A–340A and 410A–440A. As has been described previously, each word decoder receives one of the predecoded signals XA1–XA4, one of the precoded signals XB1–XB4, and one of the predecoded signals XC1–XC4. The word decoder shown in FIG. 10A comprises n-channel MOS transistors Q31–Q36, p-channel MOS transistors Q37 and Q38, and an inverter INV1. A series circuit made up of the transistors Q31, Q32, Q33, Q37 and Q38 is connected between the VCC power supply line and the ground. The gates of the transistors Q31, Q32 and Q33 respectively receive one of the predecoded signals XA1–XA4, one of the predecoded signals XB1–XB4, and one of the predecoded signals XC1–XC4. A word line reset signal RDR from the timing generator 35 is applied to the gate of the transistor Q37. The drain of the transistor Q31 is connected to the input terminal of the inverter INV1 and to the gate of the transistor Q36. The gate of the transistor Q38 is connected to the output terminal of the inverter INV1 and the transistor Q34. The gate of the transistor Q35 is connected to the transistor Q34, and the drain of the transistor Q35 is connected to a word line driving signal line WD. The source of the transistor Q35 and the drain of the transistor Q36 are connected to each other, and to the word line WL. When all the transistors Q31–Q33 are ON, the transistor Q36 is OFF, and the transistor Q35 is ON. Hence, the potential of the word line WL is approximately increased to the potential of the word line driving signal WD.

Figure 10B:
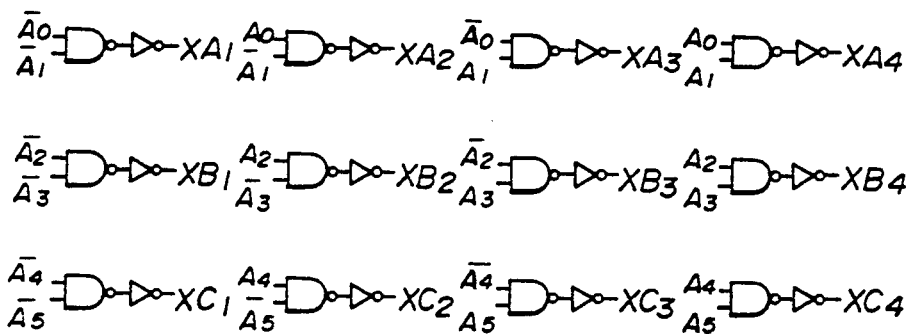
FIG. 10B is a circuit diagram of a word predecoder shown in FIG. 7A.
Figure 10C:
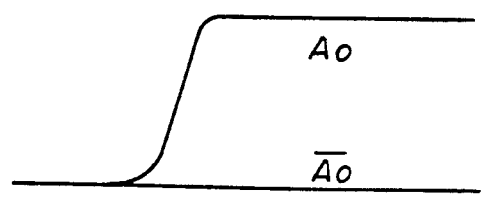
FIG. 10C is a waveform diagram of an address bit and its inverted version.

FIG. 10B is a circuit diagram of the word predecoder 25 shown in FIG. 7A. As shown in FIG. 10B, the word predecoder 25 comprises 12 pairs of NAND gates and inverters, and receives the address bits A0–A5 and $\overline{A0}$–$\overline{A5}$ (n=5). As shown in FIG. 10C, the address bits $\overline{A0}$–$\overline{A5}$ are the inverted versions of the address bits A0–A5, respectively. A pair consisting of a NAND gate and an inverter receives address bits A0 and A1, and generates the predecoded signal XA1. In this manner, the word predecoder 25 generates the predecoded signals XA1–XA4, XB1–XB4 and XC1–XC4.

Figure 11:
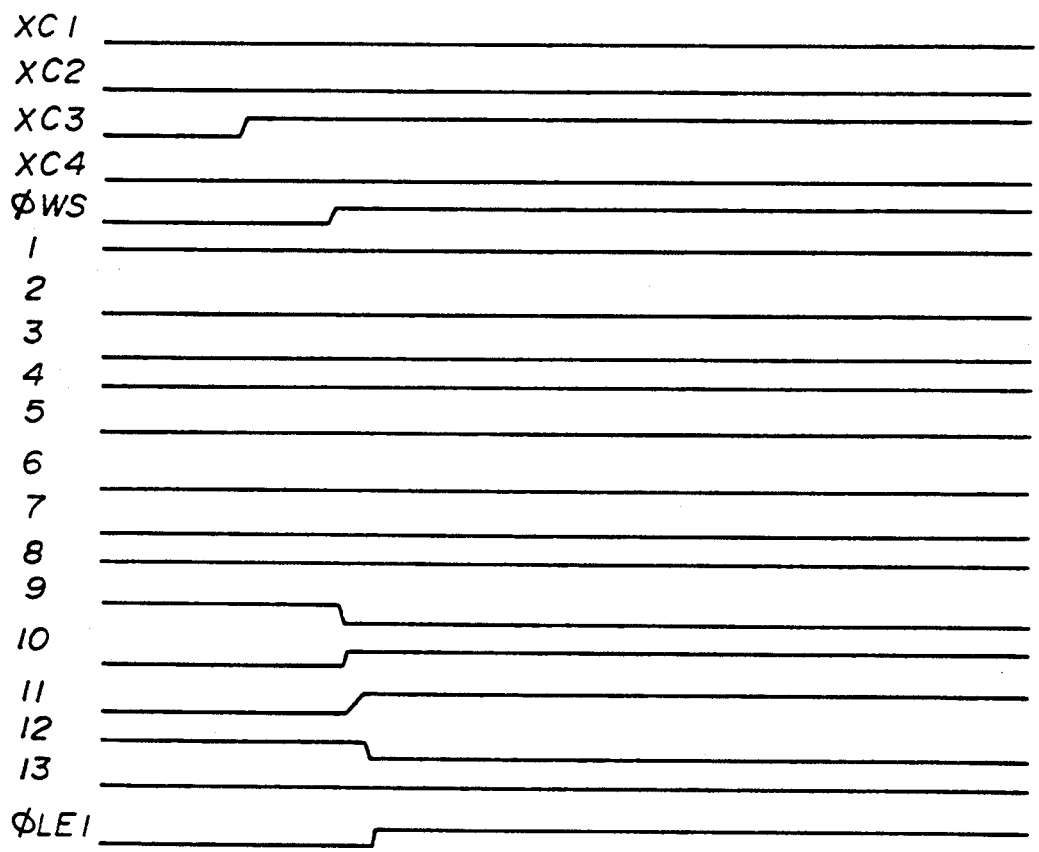
FIG. 11 is a timing chart showing the operation of the configuration shown in FIG. 7B.

A description will now be given, with reference to FIGS. 11 and 12A, of the entire operation of the DRAM according to the embodiment of the present invention. In FIG. 11, reference numbers "1"–"13" indicate signal waveforms observed at nodes "1"–"13" shown in FIG. 7B.

It will now be assumed that only the predecoded row address signal XC3 supplied to the sub blocks 130, 240, 310 and 420 is activated (switched to the high level). At the same time as the above, one of the predecoded signals XA1–XA4 and one of the predecoded signals XB1–XB4 are also activated (not shown for the sake of convenience). The above three predecoded signals select one word line in each of the sub blocks 130, 240, 310 and 420.

The timing signal $\phi$WS rises at the same time the selected word lines rise. In response to the rise of the timing signal $\phi$WS, the output signal 9 of the NAND gate 131 (FIG. 7B) receiving the predecoded signal XC3 is switched to the low level. The output signals 1, 5 and 13 of the other NAND gates 111, 121 and 141 respectively receiving the predecoded signals XC1, XC2 and XC4 are maintained at the high level. When the output signal 9 of the NAND gate 131 is switched to the low level, the output signal 10 of the NAND gate 132 is switched to the high level, and the signal 11 is switched to the high level after a fixed delay time due to the function of the capacitor connected to the inverter 133. The above fixed delay time is designed to ensure an operation in which information appears in the pair of bit lines after the word line WL is activated, and the information is propagated therein.

When the information appears in the pair of bit lines and is propagated therein, the output signal 12 of the inverter 133 is switched to the low level, and the output signal φLE1 is switched to the high level. Hence, a delay circuit having a delay path including the NAND gate 131, the NAND gate 132, the resistor, the inverter 133 and the NAND gate 142 is established. The signal φLE1 is applied, as the sense amplifier driving signal, to the gate of the transistor. When the potential of the driving signal φLE1 is switched to the high level, the sense amplifier/column decoder block 150 is activated.

The other main blocks 200–400 operate in the same manner as the main block 100. For example, the operation of the main block 300 will now be described. When the predecoded signal XC3 is switched to the high level and the timing signal φWS is switched to the high level, the output level 'a' of the NAND gate 311 connected to the XC3 line is switched to the low level. At this time, the output levels 'e', 'i' and 'm' of the NAND gates 321, 331 and 341 are maintained at the high level. A delay circuit is formed which includes a delay path a-b-c-d-f-g-h-j-k-l-φLE3. In response to the predecoded signal XC3, the sub block 310 furthest from the sense amplifier/column decoder block 350 is selected. Hence, it takes a long time for information to be read from the memory cell and transferred to the sense amplifier. It will be noted that the delay time of the delay circuit D3 becomes the longest when the predecoded signal XC3 is activated. Hence, the longest delay time ensures an operation in which information is read from the memory cell in the sub block 310 and is transferred to the sense amplifier of the block 350.

The other main blocks 200 and 400 operate in the same manner as the main blocks 100 and 300. It is to be noted that the sense amplifiers connected to the main blocks 200 and 400 start to operate at respective times different from the times when the main blocks 100 and 300 respectively start to operate. In response to the switching of the predecoded signal XC3, the sub blocks 240, 130, 420 and 310 are selected and the sense amplifier/column decoder blocks 250, 150, 450 and 350 start to operate at different times in that order. It will be noted that the sub block 240 closest to the sense amplifiers is activated first and the sub blocks 310 furthest from the sense amplifiers is activated last.

Table 1 shows the relationship among the predecoded signals XC1-XC4, a sequence in which the timing signals φLE1-φLE4 are activated, and selected sub blocks.

TABLE 1

| | Sequence of selection | | | |
|---|---|---|---|---|
| | 1 | 2 | 3 | 4 |
| XC1 | φLE4 440 | φLE3 330 | φLE2 220 | φLE1 110 |
| XC2 | φLE3 340 | φLE2 230 | φLE1 120 | φLE4 410 |
| XC3 | φLE2 240 | φLE1 130 | φLE4 420 | φLE3 310 |
| XC4 | φLE1 140 | φLE4 430 | φLE3 320 | φLE2 210 |

As has been described above, according to the present embodiment, the sub blocks of the main blocks 100–400 are selected so that the distances between the word lines in the selected sub blocks and the corresponding sense amplifiers are different from one another and so that the sense amplifier activating signals φLE1–φLE4 are turned ON at respective timings different from one another. For example, when the predecoded signal XC3 is activated, the sense amplifier operations on the main blocks 200, 100, 400 and 300 are started in this order. The sense amplifiers are sequentially activated at the different times in the order in which pieces of information have reached thereto. Hence, it becomes possible to suppress the instantaneous current flowing when the sense amplifiers are operated, without affecting the access time.

Figure 12A:
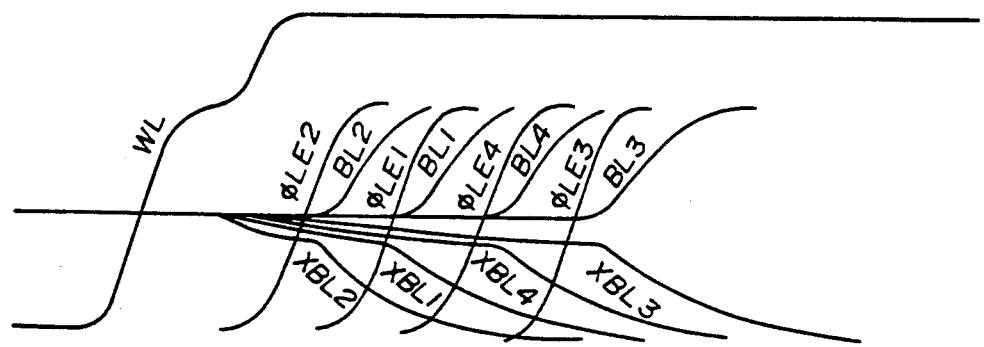
FIG. 12A is a waveform diagram showing the operation of each memory cell block shown in FIGS. 7A and 7B.
Figure 12B:
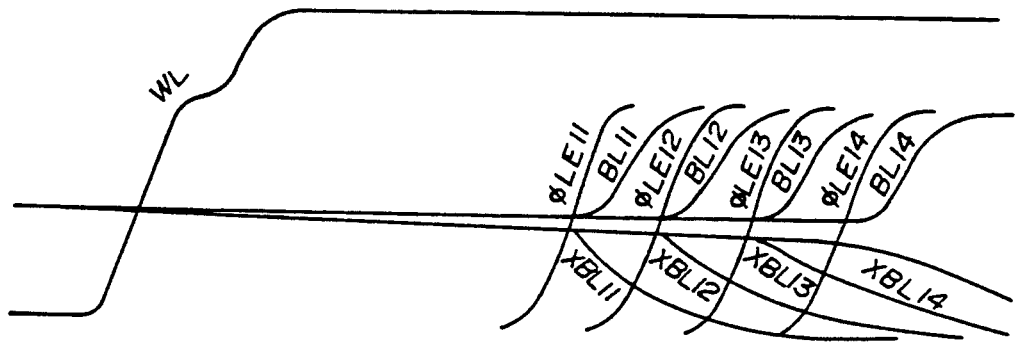
FIG. 12B is a waveform diagram showing the operation of each memory cell block in the conventional technology.

As shown in FIG. 12A, when the time necessary for information to be read from the memory cells connected to the word line furthest to the sense amplifier and to be transferred thereto has elapsed (that is, when the sense amplifier activating signal φLE3 is turned ON), the sense amplifier operation on the other blocks has been already started. On the other hand, as shown in FIG. 12B, the sense amplifier operation is not started until the time necessary for information to be read from the memory cells connected to the word line furthest to the sense amplifier and to be transferred thereto elapses.

It is possible to obtain some advantages by a variation of the above-mentioned embodiment. In the variation, only one sub-block, located at the shortest distance from the corresponding sense amplifier, is activated first in response to the switching of one of the predecoded signals.

The present invention is not limited to the specifically disclosed embodiment, and variations and modifications may be made without departing from the scope of the present invention. For example, it is possible to segment the entire memory cell array into a plurality of main blocks other than four main blocks. It is also possible to omit the transistors Q5-Q12 shown in FIG. 8. In this case, the response characteristic of the bit lines is slightly degraded, as compared to the configuration shown in FIG. 8. In addition, a slightly large amount of current is needed to drive the bit lines.

What is claimed is:

1. A semiconductor memory device comprising:
   a memory cell array divided into a plurality of blocks respectively having bit lines, word lines, and memory cells coupled to the bit lines and word lines;
   a plurality of sense amplifier means, respectively provided for the blocks and connected to the bit lines, for sensing and amplifying information stored in the memory cells;
   first means, coupled to the word lines of the memory cell array, for selecting one of the word lines for each of the blocks so that at least one of selected word lines is located at a distance from a corresponding one of the plurality of sense amplifier means, said distance being different from distances from other sense amplifier means at which other selected word lines are located; and
   second means, coupled to the plurality of sense amplifier means and the first means, for sequentially activating the plurality of sense amplifier means, starting from one of the blocks having one of the selected word lines located at a shortest distance from a corresponding one of the plurality of sense amplifier means.

2. The semiconductor memory device as claimed in claim 1, wherein said second means comprises a plurality of variable delay means, respectively provided for the plurality of sense amplifier means, for generating sense amplifier activating signals having respective delay times dependent on distances between the selected word lines and the plurality of sense amplifier means, the sense amplifier activating signals being respectively applied to the plurality of sense amplifier means.

3. The semiconductor memory device as claimed in claim 1, further comprising:
   third means for dividing each of the bit lines into a plurality of parts; and
   fourth means, coupled to the first and third means, for selectively activating parts of each of the bit lines so that a) only the parts of each of the bit lines which are closer to a corresponding one of the sense amplifier means than a corresponding one of the selected work lines and b) the part of each bit line which is adjacent the selected word line are activated when information is read from memory cells connected to the selected word lines.

4. The semiconductor memory device as claimed in claim 1, wherein:
   each of the blocks is divided into a plurality of sub blocks; and
   said first means comprises means for selecting one of the sub-blocks for each of the main blocks so that at least one of selected sub blocks is located at a distance from a corresponding one of the plurality of sense amplifier means, said distance being different from distances from other sense amplifier means at which other selected sub blocks are located.

5. The semiconductor memory device as claimed in claim 1, wherein said second means comprises means for sequentially activating the plurality of sense amplifier means in order of arrival of information at the plurality of sense amplifier means, said information being read, via the bit lines, from the memory cells respectively connected to the selected word lines of the main blocks.

6. The semiconductor memory device as claimed in claim 2, wherein:
   said first means comprises predecoder means for generating address bits from an external address signal; and
   said second means comprises decoder means for receiving predetermined address bits among said address bits and for generating the sense amplifier driving signals from the predetermined address bits.

7. The semiconductor memory device as claimed in claim 1, wherein each of the memory cells comprises one transistor and one capacitor.

8. A semiconductor memory device comprising:
   a memory cell array divided into a plurality of blocks respectively having bit lines, word lines, and memory cells coupled to the bit lines and word lines;
   a plurality of sense amplifier means, respectively provided for the blocks and connected to the bit lines, for sensing and amplifying information stored in the memory cells;
   first means, coupled to the word lines of the memory cell array, for selecting one of the word lines for each of the blocks so that selected word lines are located at mutually different distances from the plurality of sense amplifier means; and
   second means, coupled to the plurality of sense amplifier means and the first means, for sequentially activating the plurality of sense amplifier means one by one, starting from one of the blocks having one of the selected word lines located at a shortest distance from a corresponding one of the plurality of sense amplifier means.

9. The semiconductor memory device as claimed in claim 8, wherein said second means comprises a plurality of variable delay means, respectively provided for the plurality of sense amplifier means, for generating sense amplifier activating signals having mutually different delay times dependent on distances between the selected word lines and the plurality of sense amplifier means, the sense amplifier activating signals being respectively applied to the plurality of sense amplifier means.

10. The semiconductor memory device as claimed in claim 8, further comprising:
   third means for dividing each of the bit lines into a plurality of parts; and
   fourth means, coupled to the first and third means, for selectively activating parts of each of the bit lines so that a) only parts of each of the bit lines which are closer to a corresponding one of the sense amplifier means than a corresponding one of the selected word lines and b) the part of the bit line which is adjacent the selected word line are activated when information is read from memory cells connected to the selected word lines.

11. The semiconductor memory device as claimed in claim 8, wherein:
   each of the blocks is divided into a plurality of sub blocks; and
   said first means comprises means for selecting one of the sub-blocks for each of the main blocks so that selected sub blocks are located at mutually different distances from the plurality of sense amplifier means.

12. The semiconductor memory device as claimed in claim 8, wherein said second means comprises means for sequentially activating the plurality of sense amplifier means in order of arrival of information at the plurality of sense amplifier means, said information being read, via the bit lines, from the memory cells respectively connected to the selected word lines of the main blocks.

13. The semiconductor memory device as claimed in claim 9, wherein:
   said first means comprises predecoder means for generating address bits from an external address signal; and
   said second means comprises decoder means for receiving predetermined address bits among said address bits and for generating the sense amplifier driving signals from the predetermined address bits.

14. The semiconductor memory device as claimed in claim 8, wherein each of the memory cells comprises one transistor and one capacitor.

* * * * *